(12) United States Patent
Hashitani et al.

(10) Patent No.: US 9,524,961 B2
(45) Date of Patent: Dec. 20, 2016

(54) SEMICONDUCTOR DEVICE

(71) Applicant: SII Semiconductor Corporation, Chiba-shi, Chiba (JP)

(72) Inventors: Masayuki Hashitani, Chiba (JP); Hisashi Hasegawa, Chiba (JP); Takayuki Takashina, Chiba (JP); Hiroyuki Masuko, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/013,557

(22) Filed: Feb. 2, 2016

(65) Prior Publication Data

US 2016/0233207 A1    Aug. 11, 2016

(30) Foreign Application Priority Data

Feb. 5, 2015   (JP) ................................. 2015-021374
Dec. 7, 2015   (JP) ................................. 2015-238817

(51) Int. Cl.
| | |
|---|---|
| *H01L 23/62* | (2006.01) |
| *H01L 27/02* | (2006.01) |
| *H01L 29/06* | (2006.01) |
| *H01L 23/535* | (2006.01) |

(52) U.S. Cl.
CPC ........... *H01L 27/027* (2013.01); *H01L 23/535* (2013.01); *H01L 29/0619* (2013.01)

(58) Field of Classification Search
CPC ... H01L 27/0248; H01L 27/0266; H01L 23/60
USPC .......................................................... 257/355
See application file for complete search history.

(56) References Cited

U.S. PATENT DOCUMENTS

| | | | | |
|---|---|---|---|---|
| 2005/0045952 | A1* | 3/2005 | Chatty | H01L 27/0266 257/355 |
| 2010/0110596 | A1* | 5/2010 | Pugsley | H02H 9/046 361/56 |
| 2014/0376135 | A1* | 12/2014 | Huo | H02H 9/046 361/56 |
| 2015/0002965 | A1* | 1/2015 | Hayashi | H01L 27/0266 361/56 |

OTHER PUBLICATIONS

Abstract, Publication No. 2009-049331, Publication date Mar. 5, 2009.

* cited by examiner

*Primary Examiner* — Trung Q Dang
(74) *Attorney, Agent, or Firm* — Adams & Wilks

(57) ABSTRACT

In the semiconductor device including the off transistor serving as an ESD protection element and an output element between a first external connection terminal and a second external connection terminal connected to a VSS, a seal ring wire is connected in parallel, by a connection wire, to a first internal wire extending from the second external connection terminal to the source of the off transistor, and a parasitic resistance of the first internal wire is smaller than a parasitic resistance of a second internal wire connecting the source of the off transistor and a source of the output element to each other.

9 Claims, 3 Drawing Sheets

SEMICONDUCTOR DEVICE

BACKGROUND OF THE INVENTION

1. Field of the Invention

The present invention relates to a semiconductor device, which includes, in order to protect a semiconductor integrated circuit (hereinafter referred to as "IC") against destruction due to an electrostatic pulse generated by electrostatic discharge (hereinafter referred to as "ESD"), an ESD protection element formed between an external connection terminal and an internal circuit region, or between the external connection terminal and an output element.

2. Description of the Related Art

Hitherto, semiconductor devices represented by ICs include ESD protection elements, and so-called off transistors are known as the ESD protection elements. The off transistor is an N-type MOS transistor having a gate potential fixed to a ground potential (hereinafter referred to as "VSS"), and thus is in an off state as a steady state.

What is important for an ESD countermeasure is that, in order to prevent ESD destruction of an internal circuit element or an output element represented by a driver, a large amount of an electrostatic pulse as much as possible is taken by the off transistor to be discharged to the VSS. Thus, it is important that a parasitic resistance of the off transistor is reduced with respect to the VSS of the IC in order to cause a current to flow to the VSS, which is generated by an electrostatic pulse of ESD and may flow through the internal circuit element and the output element which are required to be protected against the ESD.

However, for example, when the IC is large in size, a distance from the VSS to the off transistor is increased and the influence of a parasitic resistance of a source of the off transistor becomes more conspicuous. As a result, the off transistor cannot sufficiently exhibit its performance and an electrostatic pulse originally supposed to be taken by the off transistor may be propagated to the internal circuit element or the output element, resulting in IC destruction by the ESD.

As an example of a measure for addressing this trouble, there is proposed a device configuration as described in Japanese Patent Application Laid-open No. 2009-49331. Specifically, the device configuration has a feature in that a parasitic-resistance magnitude relationship is given to a parasitic resistance from an external connection terminal to an ESD protection element and a parasitic resistance from the ESD protection element to an internal circuit element, to thereby allow the ESD protection element to take a large amount of an electrostatic pulse as much as possible.

Hitherto, power management ICs particularly represented by voltage detectors or voltage regulators have been developed aiming to attain high driving performance and high value added circuits. As a measure for attaining high driving performance, for example, there is employed such a configuration that an output element is arranged near a VSS, to thereby reduce a parasitic resistance of the output element. As a measure for obtaining high added value, for example, there is employed such a configuration that an internal circuit is formed through a related-art CMOS process to have a unique function.

However, in the former case, namely, for attaining high driving performance, there is a fear in that the parasitic resistance of the output element is reduced to be lower than that of an off transistor, with the result that an electrostatic pulse cannot be taken by the off transistor sufficiently, and is propagated to the output element to cause IC destruction.

Moreover, in the latter case, namely, for obtaining high added value, there is a fear in that a parasitic resistance of a source of the off transistor becomes more conspicuous because an IC is large in size and an external connection terminal is located away from a VSS of the IC, with the result that an electrostatic pulse cannot sufficiently be taken by the off transistor, and is propagated to the internal circuit element to cause IC destruction.

SUMMARY OF THE INVENTION

In view of the forgoing, it is an object of the present invention to provide a semiconductor device including an off transistor having a source with a reduced parasitic resistance.

In order to solve the problems described above, the following measure is taken in the present invention. Specifically, the feature of a semiconductor device represented by an IC, including an off transistor, resides in that, in order to reduce a parasitic resistance of an source of the off transistor, an internal wire that is connected to the source of the off transistor and has a potential of a VSS is connected in parallel to a seal ring wire arranged on the outer periphery of the IC.

According to the one embodiment of the present invention, in the semiconductor device including the off transistor, the parasitic resistance of the source of the off transistor may be reduced so that the off transistor may start its operation quickly to suppress propagation of an electrostatic pulse, which is generated by ESD, to an output element or an internal circuit element, thereby being capable of improving a resistance of the semiconductor device to the ESD.

DETAILED DESCRIPTION OF THE INVENTION

A mode for carrying out the present invention is described with reference to the drawings.

Figure 1:
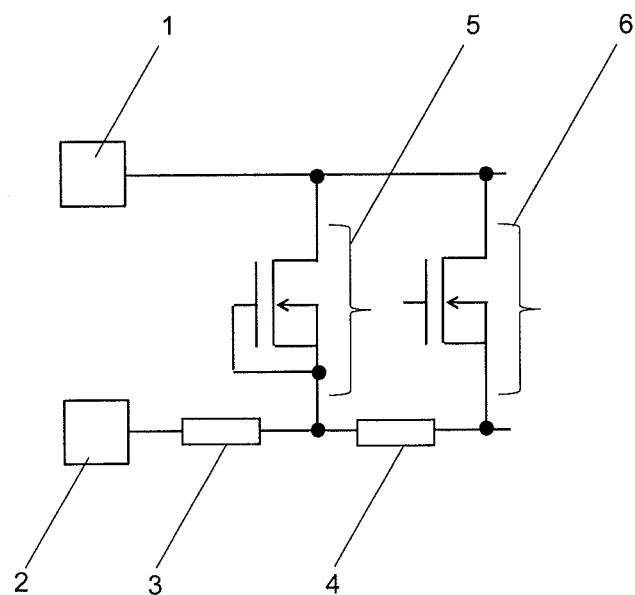
FIG. 1 is a schematic circuit diagram for illustrating external connection terminals, an ESD protection element, and an output element of a semiconductor device according to an embodiment of the present invention.

FIG. 1 is a schematic circuit diagram for illustrating external connection terminals, an ESD protection element, and an output element of a semiconductor device according to the embodiment of the present invention. A first external connection terminal 1 is, for example, a terminal for output. A second external connection terminal 2 has a power supply voltage on a lower side and is generally connected to a ground potential VSS. One of elements connected between the first external connection terminal 1 and the second external connection terminal 2 is an off transistor 5 serving as an ESD protection element. Further, an output element 6 is connected in parallel to the off transistor 5. That is, an output of the output element 6 is connected to the first external connection terminal 1.

A parasitic resistance of a source of the off transistor 5, which is represented by reference numeral 3 in FIG. 1, is a resistance included in a first internal wire extending from the source of the off transistor 5 to the second external connection terminal 2 (hereinafter referred to as "source parasitic resistance 3 of off transistor"). A parasitic resistance of a source of the output element 6, which is represented by reference numeral 4 in FIG. 1, is a resistance included in a second internal wire extending from the source of the output element 6 to the source of the off transistor 5. In the following, this parasitic resistance is referred to as the source parasitic resistance 4 of the output element.

The present invention has a feature in that the source parasitic resistance 3 of the off transistor is reduced to be lower than the source parasitic resistance 4 of the output element. The embodiment for describing the feature in detail is described with reference to FIG. 2.

Figure 2:
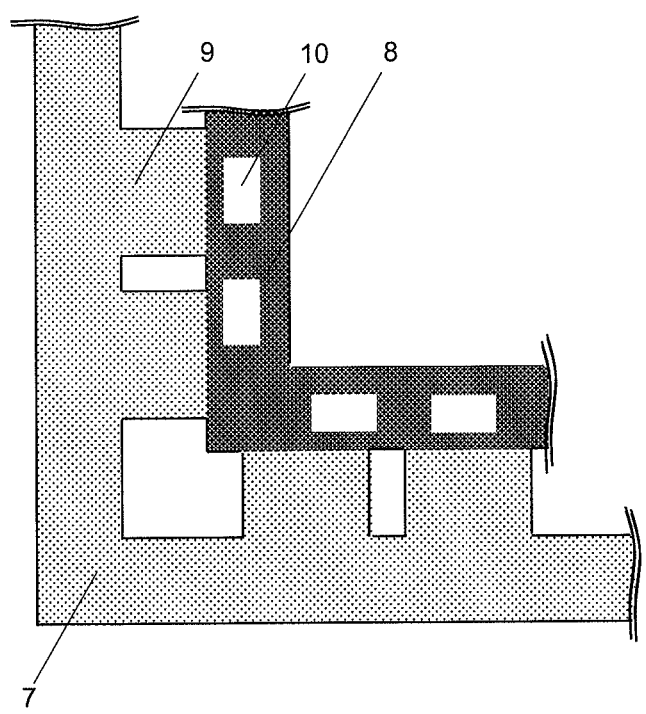
FIG. 2 is a schematic layout diagram for illustrating a feature of the present invention.

FIG. 2 is a diagram of part of an IC layout, for illustrating the shape of wiring. A seal ring wire 7 and an internal wire 8 that are arranged on the outer periphery of an IC are illustrated. The internal wire 8 is extended from the second external connection terminal 2 to the off transistor 5, the internal wire 8 is electrically connected to the seal ring wire 7 by a connection wire 9, and the internal wire 8 and the seal ring wire 7 are connected in parallel to each other, thereby being capable of reducing the source parasitic resistance 3 of the off transistor.

In this case, the seal ring wire 7 is connected to the second external connection terminal having a lower potential than the first external connection terminal, and has a potential of, for example, the ground potential VSS.

Moreover, the seal ring wire 7 that is generally arranged on the outer periphery of the IC described above is wired as follows. As mentioned above the seal ring wire 7 is connected to the second external connection terminal, and has, for example, the ground potential VSS. The seal ring wire 7 can be arranged so as to continuously surround the entire outer periphery of the IC. Moreover, the seal ring wire 7 having one cut portion can also be arranged so as to mostly surround the outer periphery of the IC in a discontinuous manner. The seal ring wire 7 is arranged as described above because it is preferred that the potential be the same throughout the seal ring wire 7.

Figure 3:
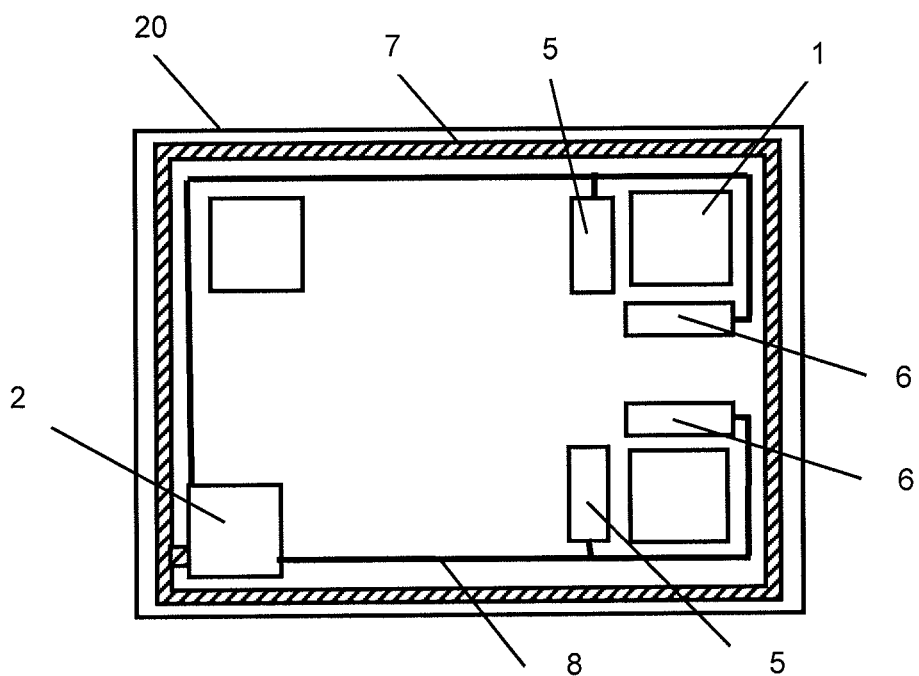
FIG. 3 is a diagram of an example of a semiconductor device in which the present invention can be carried out.

FIG. 3 is a diagram of an example of a semiconductor device in which the present invention can be carried out. As illustrated in FIG. 3, in general, the seal ring wire 7, the second external connection terminal 2, and the off transistor 5 are often arranged along the outer periphery of a semiconductor device 20 that is an IC having a chip shape. Thus, it is not difficult to connect the internal wire 8 in parallel to the seal ring wire 7, the internal wire 8 connecting the second external connection terminal 2 and the off transistor 5 to each other.

Meanwhile, the wire extending from the source of the output element 6 to the source of the off transistor 5 is a single wiring layer and has a thin width, thereby being capable of relatively increasing a parasitic resistance of the wire. Further, the output element 6 is arranged along the internal wire 8 extending from the second external connection terminal 2 so as to be located farther than the off transistor 5 with respect to the second external connection terminal 2, thereby being capable of relatively increasing a parasitic resistance of the output element 6 with ease.

Further, when multilayer wiring is used, the internal wire 8 of FIG. 2 may have a laminate structure including a bottom-layer wire and a top-layer wire. In this case, the laminate structure may include a plurality of middle-layer wires between the bottom-layer wire and the top-layer wire. The layers may be electrically connected to each other via through holes 10 (also called vias). In the laminate structure, the width of the top-layer wire may be the same as or different from that of the bottom-layer wire. With this, the source parasitic resistance 3 of the off transistor can be reduced to be lower than the source parasitic resistance 4 of the output element.

Further, the above-mentioned laminate structure including a plurality of wires has the through holes 10 for electrically connecting the plurality of wires to each other. The through holes 10 may be continuously formed or may be formed with intervals in a discontinuous manner.

Moreover, the internal wire 8 is electrically connected to the seal ring wire 7 by the connection wire 9. The connection wire 9 can connect the wires to each other regardless of whether the connection wire 9 is formed as the bottom-layer wire, the top-layer wire, or one of other middle-layer wires. Further, in order to connect the seal ring wire 7 and the internal wire 8 to each other, a plurality of the connection wires 9 can be arranged in parallel to each other in a discontinuous manner as illustrated FIG. 2, or one connection wire 9 can be continuously arranged as a sheet.

Note that, in the above description, the output element 6 is exemplified as an element located on the inner side of the off transistor 5 in the IC. However, it is obvious that the present invention can be carried out even when the output element 6 is an ordinary internal circuit.

What is claimed is:

1. A semiconductor device, comprising:
   a first external connection terminal;
   a second external connection terminal connected to a potential lower than the potential of the first external connection terminal;
   an off transistor serving as an ESD protection element and an output element that are connected in parallel to each other between the first external connection terminal and the second external connection terminal; and
   a seal ring wire connected to the second external connection terminal,
   wherein a first internal wire and the seal ring wire are connected in parallel to each other by a connection wire so that a source parasitic resistance of the off transistor is smaller than a source parasitic resistance of the output element, the source parasitic resistance of the off transistor comprising a parasitic resistance of the first internal wire connecting the second external connection terminal and a source of the off transistor to each other, the source parasitic resistance of the output element comprising a parasitic resistance of the second internal wire connecting the source of the off transistor and a source of the output element to each other.

2. A semiconductor device according to claim 1, wherein the first internal wire has a laminate structure including a bottom-layer wire and a top-layer wire.

3. A semiconductor device according to claim 2, wherein the first internal wire has the laminate structure including a middle wire layer between the bottom-layer wire and the top-layer wire.

4. A semiconductor device according to claim 2, wherein the wires included in the laminate structure are electrically connected to each other via a through hole.

5. A semiconductor device according to claim 2, wherein the connection wire comprises one of the bottom-layer wire and the top-layer wire.

6. A semiconductor device according to claim 3, wherein the connection wire comprises one of the bottom-layer wire, the top-layer wire, and the middle wire layer.

7. A semiconductor device according to claim 6, wherein the connection wire configured to connect the seal ring wire and the internal wire to each other comprises one of: a plurality of connection wires discontinuously arranged in parallel to each other; and one connection wire arranged as a sheet.

8. A semiconductor device according to claim 1, wherein the seal ring wire is arranged so as to continuously surround an outer periphery of an IC.

9. A semiconductor device according to claim 1, wherein the seal ring wire is arranged so as to surround an outer periphery of an IC except for one discontinuous portion of the seal ring wire.

* * * * *